United States Patent
Laslo

(10) Patent No.: US 11,888,480 B2
(45) Date of Patent: Jan. 30, 2024

(54) METHOD AND APPARATUS FOR SYNCHRONIZING TWO SYSTEMS

(71) Applicant: Microsoft Technology Licensing, LLC, Redmond, WA (US)

(72) Inventor: Ori Laslo, Rehovot (IL)

(73) Assignee: Microsoft Technology Licensing, LLC., Redmond, WA (US)

( * ) Notice: Subject to any disclaimer, the term of this patent is extended or adjusted under 35 U.S.C. 154(b) by 0 days.

(21) Appl. No.: 17/781,063

(22) PCT Filed: Nov. 9, 2020

(86) PCT No.: PCT/US2020/059599
§ 371 (c)(1),
(2) Date: May 31, 2022

(87) PCT Pub. No.: WO2021/126405
PCT Pub. Date: Jun. 24, 2021

(65) Prior Publication Data
US 2023/0006676 A1 Jan. 5, 2023

(30) Foreign Application Priority Data
Dec. 19, 2019 (EP) .................................. 19217797

(51) Int. Cl.
*H03K 21/02* (2006.01)
*H03L 7/08* (2006.01)

(52) U.S. Cl.
CPC .............. *H03K 21/02* (2013.01); *H03L 7/08* (2013.01)

(58) Field of Classification Search
None
See application file for complete search history.

(56) References Cited

U.S. PATENT DOCUMENTS

| | | | |
|---|---|---|---|
| 5,818,886 A * | 10/1998 | Castle | G11C 7/22 327/160 |
| 5,966,417 A | 10/1999 | Mcnamara et al. | |
| 6,577,174 B2 | 6/2003 | Locker et al. | |
| 6,615,281 B1 | 9/2003 | Temple | |
| 7,394,830 B2 | 7/2008 | Chapman | |
| 7,437,485 B1 | 10/2008 | Kruglikov et al. | |
| 8,498,315 B2 | 7/2013 | Frank et al. | |
| 10,292,120 B2 | 5/2019 | Vargas et al. | |
| 2003/0018462 A1 | 1/2003 | Chen et al. | |

FOREIGN PATENT DOCUMENTS

| | | |
|---|---|---|
| EP | 1041469 A2 | 10/2000 |
| WO | 2017015222 A1 | 1/2017 |

OTHER PUBLICATIONS

"European Search Report Issued in European Patent Application No. 19217797.0", dated Jun. 29, 2020, 14 Pages.
"International Search Report and Written Opinion Issued in PCT Application No. PCT/US20/059599", dated Jan. 18, 2021, 17 Pages.

* cited by examiner

*Primary Examiner* — Cassandra F Cox
(74) *Attorney, Agent, or Firm* — Barta, Jones & Foley, PLLC

(57) ABSTRACT

An apparatus and method for synchronizing a triggered system to a triggering system by tracking the timing of rising and falling edges of a clock signal at the triggered system and using the tracked timing values for phase shift adjustment of a time base at the triggered systems.

20 Claims, 7 Drawing Sheets

METHOD AND APPARATUS FOR SYNCHRONIZING TWO SYSTEMS

BACKGROUND

In many applications, there are interacting systems that run on independent time bases (e.g. system clocks) which control a timing of their operations (e.g. start, stop, wait, etc.). In such applications, a common time base of these systems controls the independent time bases to ensure that their operations are conducted in a synchronized manner in comparison to one another. Examples for such applications are touch and stylus sensing chips which together control a large or foldable touch screen, or networked devices which communicate with each other, or the like.

SUMMARY

This Summary is provided to introduce a selection of concepts in simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

The disclosure in some embodiments relates to an apparatus for synchronizing a counter to an input trigger signal, the apparatus comprising a data acquisition module (logger circuit) for sampling and recording values of the counter in response to a detection of rising and/or falling edges of the input trigger signal, wherein the sampling is performed at rising and falling edges of a common clock signal supplied to the counter and the data acquisition module; and a control circuit for reading the recorded values and calculating at least one of an offset and a configurable delay of the counter based on the recorded values and predetermined collected values.

According to a further aspect, a method of synchronizing a counter to an input trigger signal is provided, the method comprising sampling and recording values of a counter in response to a detection of rising and/or falling edges of the input trigger signal, wherein the sampling is performed at rising and falling edges of a common clock signal supplied to the counter; and calculating at least one of an offset and a configurable delay of the counter based on the recorded values and predetermined collected values.

Unless otherwise defined, all technical and/or scientific terms used herein have the same meaning as commonly understood by one of ordinary skill in the art. Although methods, components and signals similar or equivalent to those described herein can be used in practice or testing of embodiments of the disclosure, example methods and/or components and/or signals are described below. In addition, the components, signals, methods, and examples are illustrative only and are not intended to be necessarily limiting.

BRIEF DESCRIPTION OF THE DRAWINGS

To assist understanding of the present disclosure and to show how embodiments of such may be put into effect, reference is made, by way of example only, to the accompanying drawings in which.

DETAILED DESCRIPTION OF EMBODIMENTS

The present disclosure is directed to an improved synchronization of time bases of two or more systems to one another with higher accuracy of less than one clock cycle. In examples, the accuracy may be in the range from one quarter to one eighth of a clock cycle of the time bases. Conventional synchronization methods are able to synchronize the two systems with a maximum accuracy of one clock cycle of the time base.

Figure 1:
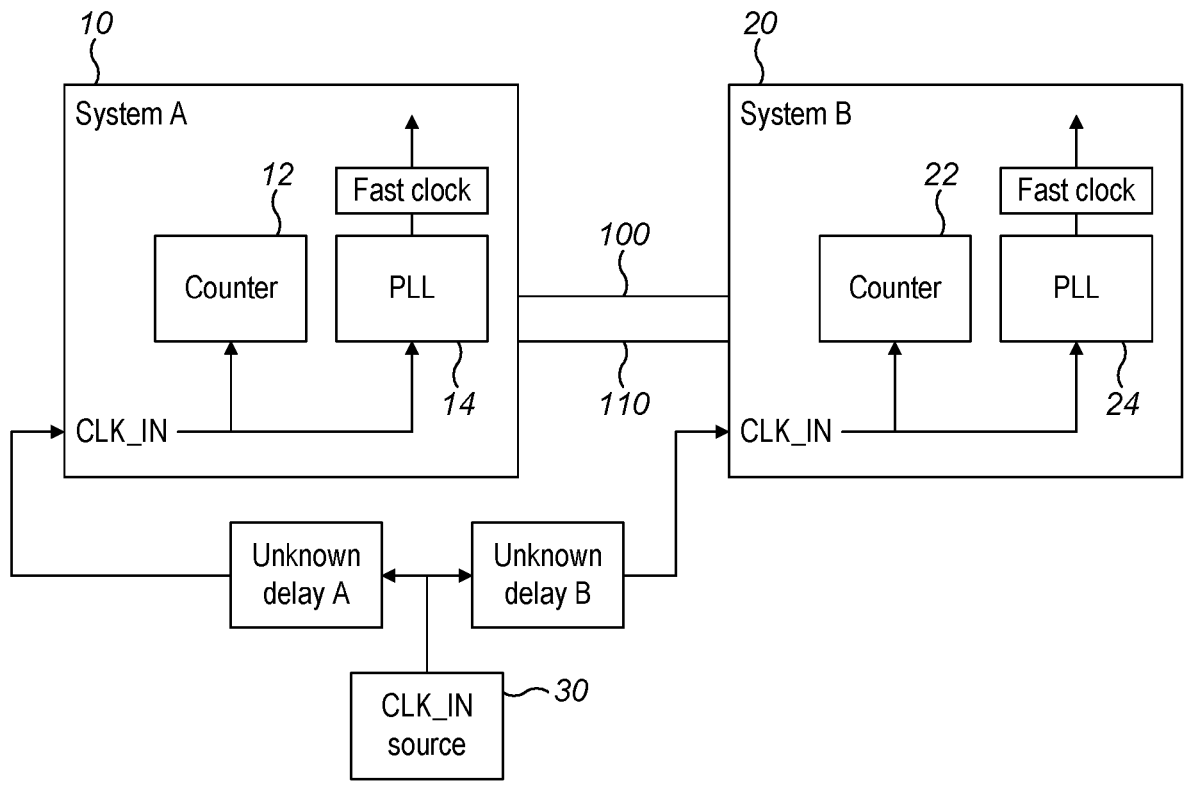
FIG. 1 is a schematic block diagram of an example of two interactive systems operated on the basis of a common clock signal.

FIG. 1 is a schematic block diagram of an example of two interactive systems A and B 10, 20 operated on the basis of a common clock signal CLK_IN generated by a common clock source (e.g. clock generator) 30. The two systems A and B 10, 20 may be implemented as electric circuits implemented on different parts of an integrated circuit or in different integrated circuits. In examples, the common clock signal CLK_IN may be used as a common time base of the two systems A and B 10, 20 to control their independent time bases to ensure that their operations are conducted in a synchronized manner in comparison to one another. Examples for such systems may be touch and stylus sensing chips which together control a large or foldable touch screen, or networked devices which communicate with each other, or any other types of interoperating or interactive systems that need to be synchronized for proper operation.

Figure 2:
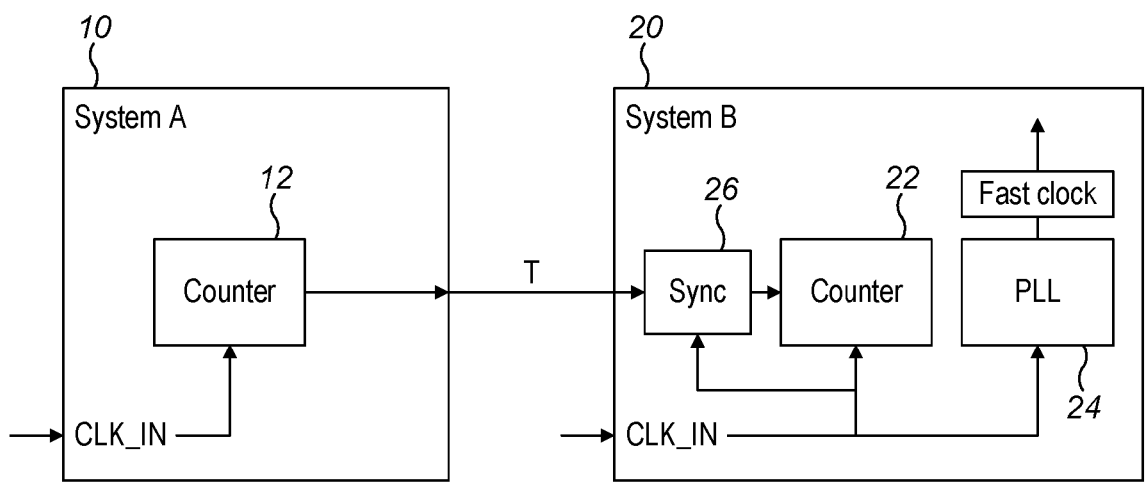
FIG. 2 is a schematic block diagram of an example of a conventional approach for synchronization of two interactive systems operated on the basis of a common clock signal.
Figure 4:
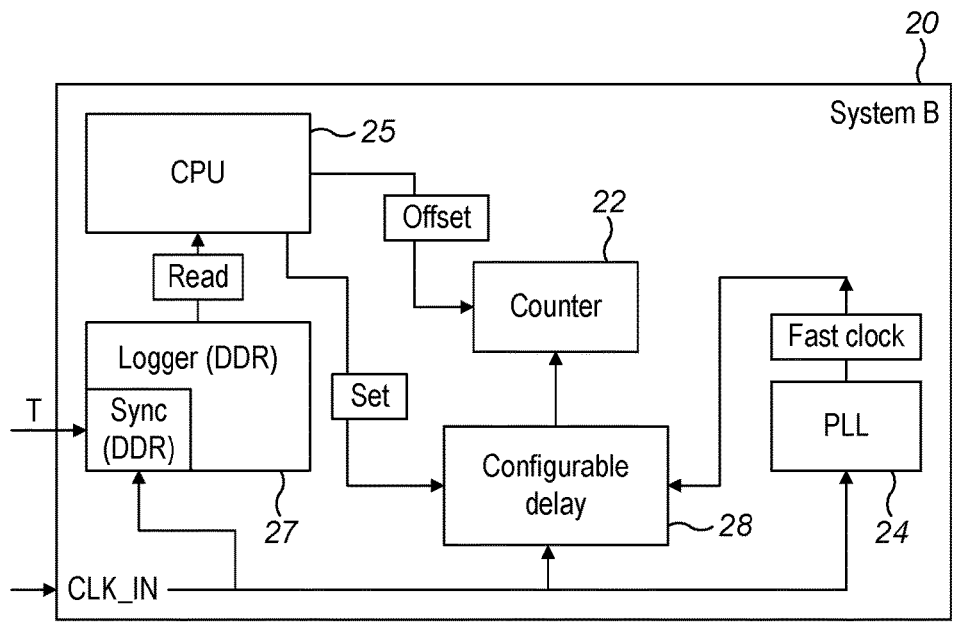
FIG. 4 is a schematic block diagram of an example system with enhanced synchronization for improved accuracy.

It is noted that, for reasons of brevity, only those system components are shown in FIG. 1 and the following FIGS. 2 and 4, that are useful for explaining specific example operations of example embodiments. Moreover, unless indicated otherwise, components or signals with identical reference signs have same or similar functionalities and/or structures which may be described only once in the present disclosure.

In examples, the common clock signal may be in the form of a square wave with a 50% duty cycle and a fixed, constant frequency. Circuits of the two systems A and B 10, 20 using the clock signal CLK_IN for synchronization may become active at either the rising edge, the falling edge, or, in the case of double data rate (DDR), both at the rising and at the falling edges of the clock cycle.

In examples, the common clock signal CLK_IN or a clock signal derived from the common clock CLK_IN may be gated, that is, combined with a controlling signal (not shown) that enables or disables the clock signal CLK_IN e.g. for a certain part of a circuit of the systems. The time base of the common clock source 30 may be constantly running at a relatively low speed in comparison to a faster internal clock rate ("fast clock") available in each of the systems 10, 20.

In addition, each of the systems 10, 20 may comprise a phase locked loop (PLL) circuit 14, 24 which generates based on the common clock signal CLK_IN a higher frequency used for internal operations that require higher clock rates (e.g. the fast clock), such as an internal central processing unit (CPU, not shown). The PLL circuits 14, 24 may be control circuits that generate the fast clock with a phase related to the phase of the input clock signal CLK_IN. There are several different types of circuits that may be used to implement the PLL circuits 14, 24. In examples, a simple option may be an electronic circuit consisting of a variable frequency oscillator and a phase detector in a feedback loop. The oscillator generates a periodic signal, and the phase detector compares the phase of that signal with the phase of the input periodic signal, adjusting the oscillator to keep the phases matched. Keeping the input and output phase in lock step also implies keeping the input and output frequencies the same. Consequently, in addition to synchronizing the fast clock and the common clock signal CLK_IN, the PLL circuits 14, 24 can track the input frequency of the common clock signal CLK_IN, or they can generate a frequency that is a multiple of the input frequency.

In examples, the PLL circuits 14, 24 may be turned off/on frequently to save power, so that the fast clock can be temporarily turned off for power saving considerations. Thereby, power can be saved by effectively shutting down portions of digital circuit(s) of the systems 10 and 20 when they are not in use.

In examples, the common clock source 30 may comprise an electronic oscillator (circuit) that produces the common clock signal CLK_IN which can range from a simple symmetrical square wave to more complex arrangements. The basic parts of the clock source 30 may be a resonant circuit and an amplifier. The resonant circuit may be a quartz piezo-electric oscillator, although simpler tank circuits and even resistor and capacitance (RC) circuits may be used as well. The amplifier circuit may be used to invert the signal from the oscillator and feed a portion back into the oscillator to maintain oscillation. In examples, the common clock source 30 may have additional sections to modify a basic clock signal. As an example, the common clock source 30 may incorporate logic to convert a 50% duty cycle (which is typical of raw oscillators) into a different duty cycle.

In examples, other optional sections of the common clock source 30 may include hardware and/or software implemented frequency divider or clock multiplier sections. Furthermore, programmable clock generators may allow a number used in the divider or multiplier to be changed, allowing any of a wide variety of output frequencies to be selected without modifying the hardware.

The two systems of FIG. 1 share the common clock source 30, e.g., by having one of the two systems 10, 20 (e.g. system A 10) drive the CLK_IN input of the other one (e.g. system B 20, or by both systems 10, 20 being driven by the common clock source 30 as shown in FIG. 1. However, due to propagation delays within the systems 10, 20 and/or throughout the clock path between the systems and/or from the common clock source 30 to each of the systems 10, 20, there is an unknown phase shift between the two CLK_IN domains (i.e. they are frequency aligned, but not phase aligned). As indicated in FIG. 1, this unknown phase shift may be caused by respective unknown delays A and B between the common clock source 30 and the respective CLK_IN inputs of the two systems 10, 20.

Furthermore, in examples, in each of the two systems 10, 20, a respective counter 12, 22 is provided which accumulates the number of clock events of the respective clock signals CLK_IN to provide time signals (e.g. time stamps) as a time base that must be calibrated very accurately. Throughout the present disclosure, the time base of each of the two systems 10, 20 will therefore be referred to as "counter" 12, 22.

In examples, the counters 12, 22 may store the number of times a particular event (i.e. a clock cycle or edge of the input clock signal CLK_IN) has occurred. They may be implemented as a sequential digital logic circuit with an input line for the clock signal CLK_IN and multiple output lines. The values on the output lines may represent a number in a binary or binary coded digital (BCD) number system. Each pulse or pulse edge applied to the clock input increments or decrements the number in the counter. More specifically, in examples, the circuits of the counters 12, 22 may be constructed of a number of flip-flops connected in cascade. In examples, the counters 12, 22 may be manufactured as separate integrated circuits and also incorporated as parts of larger integrated circuits. In other examples, the counters 12, 22 may be implemented by respective processor circuits that are controlled via a software program that implements a counter function.

In examples, the counters 12, 22 may include some form of amplifier, filtering and shaping circuitry at the input. Digital signal processing (DSP) technology, sensitivity control and hysteresis are other techniques that may be applied to improve performance of the counters 12, 22.

As shown in FIG. 1, the internal clock signals CLK_IN of each of the two systems 10, 20 are supplied to the respective counter 12, 22, so that the respective counter 12, 22 of each system operates on the basis of the CLK_IN domain. However, in examples, each of the two system 10, 20 may be powered up independently, and their boot times may not be identical, so that each of the respective counters 12, 22 may start counting at a different time.

Furthermore, the interaction between the two systems 10, 20 may be based on an exchange of input/output (IO) signals 100 and/or communication signals 110 via respective connection channels or lines. In examples, such communication signals 110 may be based on Bluetooth, Wi-Fi, near-field communication (NFC), etc., wherein respective communication units (not shown) may include a transceiver to transmit/receive communication commands, pairing requests, etc. from the communication unit of the respective other system. Additionally or alternatively, the communication between the two systems 10, 20 may be based on wired transmissions, for example, Universal Serial Bus (USB) or Ethernet connections or other wired connection systems.

The systems 10, 20 may further comprise a power supply (not shown), which may comprise a battery for powering the various components of the systems 10, 20. The battery may be rechargeable, replaceable, disposable, etc.

FIG. 2 is a schematic block diagram of an example of an approach for synchronizing the two interactive systems A and B 10, 20 operated on the basis of the common clock signal CLK_IN. According to this approach, one of the two systems 10, 20 (e.g. system A 10, triggering system) will send a "trigger" signal T to the other one of the two systems 10, 20 (e.g. system B 20, triggered system) e.g. on one of the I/O connection lines when its counter (e.g. counter 12) reaches a certain pre-defined count value. Throughout the present disclosure, this count value is marked with the letter "Y".

In examples, the trigger signal T may by a pulse-shaped signal (where a pulse indicates a trigger event) or a binary signal with two states (where a transition from one state to the other indicates a trigger event) or a predefined signal pattern or value (where the pattern or value indicates the trigger event).

When the trigger event of the trigger signal T is detected by the triggered system (e.g. system B 20), the triggered system may control the counter 22 to load a value of Y+Δ (wherein the value of Δ depends on the propagation delay of the trigger signal T and optionally an internal delay of a path of the trigger signal T (e.g. how many sampling flip-flops are in the path of the trigger signal).

However, due to the fact that the two counters 12, 22 of the two systems 10, 20 work on clocks that are not phase-aligned, the triggered system (e.g. system B 20) may comprise an initial synchronizing circuit (Sync) 26 (synchronizer) for the trigger signal T, transferring or adapting it to the timing of its own clock signal CLK_IN, i.e., its own CLK_IN domain.

The synchronizing circuit 26 may be provided at both systems 10, 20 and may be used as an interface so that the trigger signal T from the triggering system is reliably interpreted by the triggered system. Thus, whenever there is a transfer of the trigger signal T between the two systems 10, 20 operating at same frequency but with different phases, the synchronizing circuit 26 is used as an interface. In examples, the synchronizing circuit 26 may use flip flop circuits offering single or double latency delays at the output. For example, the synchronizing circuit 26 may have a delay of anywhere between two and three cycles of the clock signal CLK_CIN.

However, the synchronizing circuit 26 adds a delay with an indeterministic portion of one CLK_IN cycle, because it is unknown when the next rising edge of the clock signal CLK_IN after the detection of the trigger signal T (e.g. trigger event) occurs. As a result, the inaccuracy of the synchronization process may reach up to a single cycle of the clock signal CLK_IN. Due to the indeterministic nature of this inherent inaccuracy, it is not possible to compensate for it by software of hardware based on a predetermined fixed compensation value that will always work.

Figure 3:
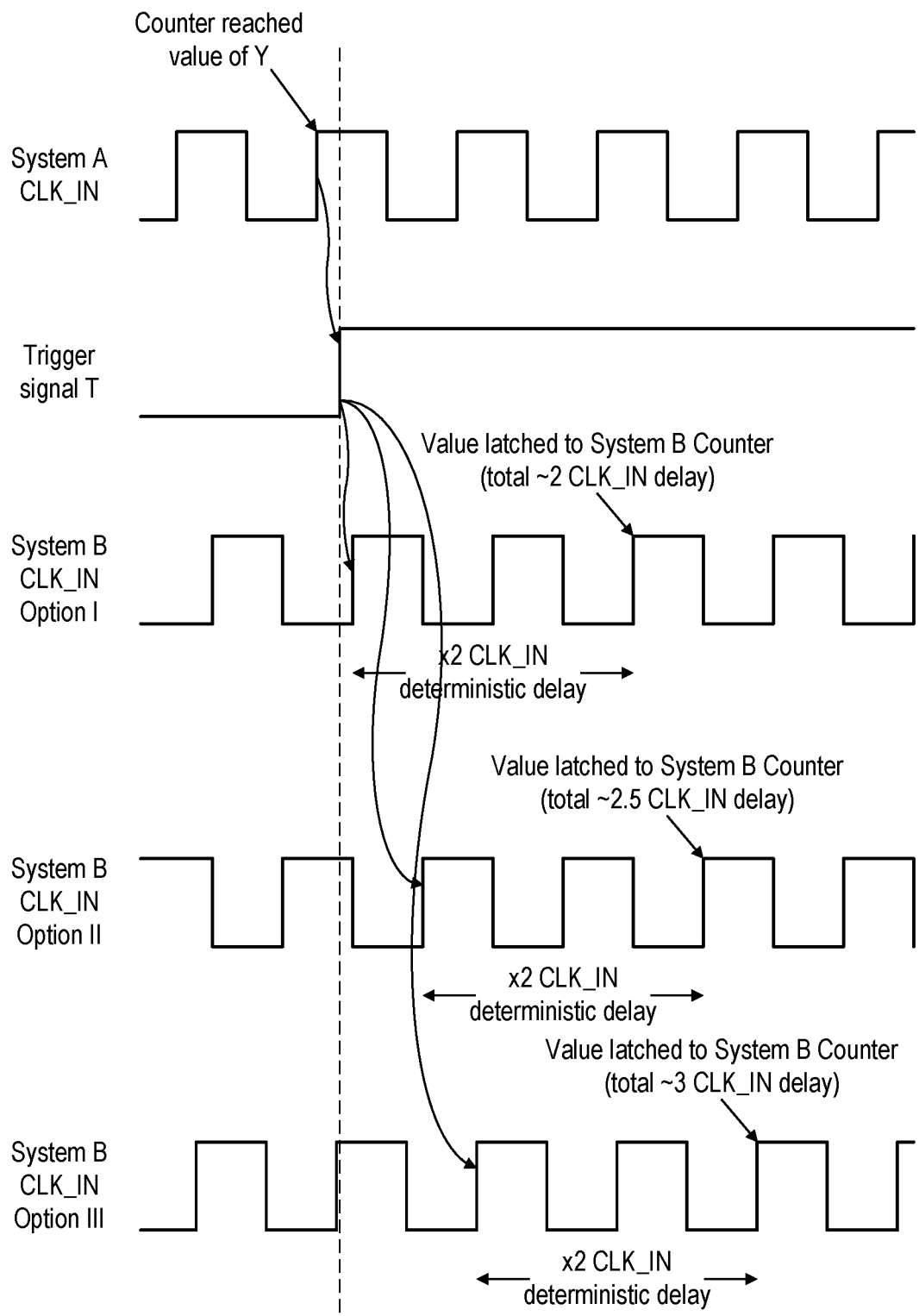
FIG. 3 is a schematic diagram with examples of waveforms of a trigger signal and related clock signals to explain an indeterministic nature of synchronization of two systems operated on the basis of a common clock signal.

FIG. 3 is a schematic diagram with examples of waveforms of the trigger signal T (second waveform from the top) and related clock signals to explain the above indeterministic nature of synchronizing the two systems.

The triggering system (system A) is operated on the basis of a first clock signal CLK_IN (uppermost waveform). Additionally, FIG. 3 shows three options I to III of example timings of the second clock signal CLK_IN at the triggered system (system B), wherein the next rising edge of the second clock signal CLK_IN may be delayed by less than one half clock cycle (option I, middle waveform), more than one half clock cycle (option II, second last waveform form the top), and close to but less than one clock cycle (option III, lowermost waveform) with respect to the rising edge (trigger event) of the trigger signal T.

As can be gathered from FIG. 3, when the counter 12 of the triggering system (system A) 10 has reached the triggering value of "Y", the trigger signal T is activated e.g. by changing its binary state and creating a rising edge, or vice versa. With the next rising edge of the clock signal CLK_IN at the triggered system (system B) 20, an adjusted or compensated value of Y+Δ will be latched to the counter 22 at the triggered system 20 after a deterministic delay of e.g. two clock cycles (time periods) of the clock signal CLK_IN caused by the synchronizing circuit 26.

Thus, the total delay until the compensated value of Y+Δ is latched at the counter 22 of the triggered system 20 depends on the initial indeterministic delay caused by the phase difference between the first clock signal CLK_IN of the first system 10 and the second clock signal CLK_IN of the second system 20. For option I, the total delay amounts to about two time periods of the clock signal CLK_IN. For option II, the total delay amounts to about two and a half time periods of the clock signal CLK_IN. For option III, the total delay amounts to about three time periods of the clock signal CLK_IN.

As a result, selecting the delay compensation value of Δ for the counter 22 of the triggered system 20 to be "2" may result in an inaccuracy of plus one CLK_IN cycle, while selecting the delay compensation value of Δ to be "3" may result in an inaccuracy of minus one CLK_IN cycle.

FIG. 4 is a schematic block diagram of an example system with an enhanced synchronization approach for improved accuracy.

It is noted that blocks with reference numbers identical to those in FIGS. 1 and 2 have same or similar functions and structures and are therefore not described again here.

In example embodiments, the triggered system (e.g. system B) 20 comprises a "logger" module or circuit 27 which is configured to detect edges of the trigger signal T (e.g. rising and/or falling edges) and to record the value of the counter 22 of the triggered system 20 after which the edge of the trigger signal T was detected. The logger circuit 27 may comprise a synchronizing circuit similar to the synchronizing circuit 26 of FIG. 2. As regards their clocking, both the logger circuit 27 and the synchronizing circuit are configured to become active at the rising edges and at the falling edges of the clock cycle of the clock signal CLK_IN (i.e. double data rate (DDR) capability). Thus, if the logger circuit 27 has the synchronizing circuit at its input, an indeterminism of one sampling cycle (i.e. 0.5 CLK_IN clock) is created.

The logger circuit 27 is a data acquisition module which comprises or cooperates with an on-board memory (not shown) that is used to store acquired data (i.e. counter values). In examples, this memory may be a battery-backed static random access memory, flash memory or electrically erasable programmable read-only memory (EEPROM) or the like.

As indicated above, in example embodiments, the logger circuit 27 is configured to operate from the CLK_IN domain and to sample the counter values at double sampling rate (i.e. both on rising and falling edge of the clock signal CLK_IN). Therefore, the recorded counter values may be either integer (rising edge sample) or integer+0.5 (falling edge sample).

Furthermore, in example embodiments, the triggered system 20 may comprise a configurable delay module or circuit 28 which may add a delay to the input clock signal CLK_IN supplied to the counter 22 and which may be controlled by the fast clock generated at the output of the PLL circuit 24 of the triggered system 20. In examples, the delay of the configurable delay circuit 28 may be implemented by a software procedure (e.g. compensation by the software procedure), a controllable delay line, a controllable series of logic gates, or the like. In other sample embodiments, the configurable delay circuit 28 may be configured to add the delay to an output value of the counter 22 (e.g. by delaying a binary code output of the counter 22). In further sample embodiments, the configurable delay circuit 28 may be configured to add the delay to a trigger output generated on the basis of the output value of the counter 22, e.g., when the output value of the counter 22 reaches a predetermined value.

Additionally, in example embodiments, the triggered system 20 may comprises a control circuit 25 (e.g. a central processing unit (CPU) or another programmable logic which can be configured to read the recorded counter values of the logger circuit 27 and to apply an offset value to the counter 22 and/or set a delay value at the configurable delay circuit 28 based on the recorded counter values.

Figure 5:
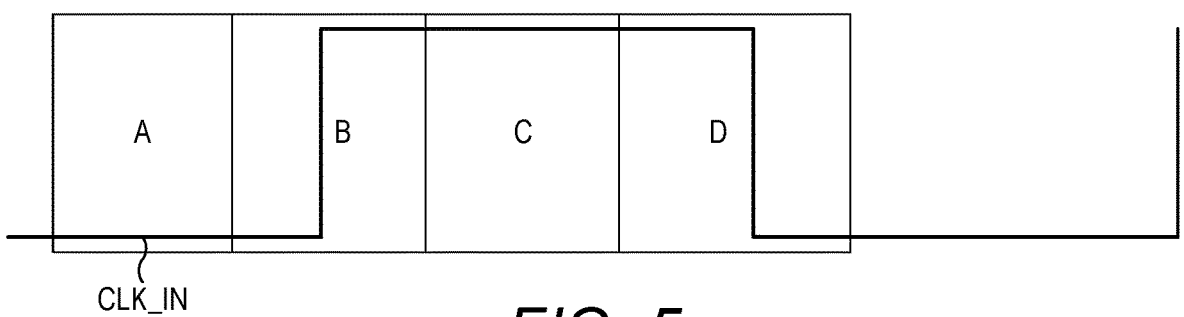
FIG. 5 is a schematic diagram with an example of a waveform of a common clock signal and four regions to explain the indeterministic nature of synchronization.

FIG. 5 is a schematic diagram with an example of a waveform of the common clock signal CLK_IN at the triggered system 20 and four regions A to D to explain the indeterministic nature of synchronization. The edge(s) of the trigger signal T (e.g. pulse train) received from the triggering system 10 (e.g. system A) may be received in one of the four regions A to D in comparison to the CLK_IN domain of the triggered system 20 (e.g. system B).

More specifically, in examples, region A may designate a region located before a rising edge of the clock signal CLK_IN with appropriate setup and hold times. This region A therefore results in stable and consistent recording of counter samples for all edges of the trigger signal T and the recordings of the counter values will have integer values (i.e. least significant bit (LSB) of the binary counter value equals "0"). Furthermore, in examples, region B may designate a region located around a rising edge of the clock signal CLK_IN with insufficient setup and hold times. This region B therefore results in unstable recording of counter samples for the pulse train edges, wherein some counter values are latched on a rising edge (i.e. LSB=0) while other counter values are latched on the next falling edge (i.e. LSB=1). Therefore, this region B, in fact, is what creates the indeterministic nature of the synchronizing circuit at the input of the logger circuit 27. Additionally, in examples, region C may designate a region located before a falling edge of the clock signal CLK_IN with appropriate setup and hold times. Therefore, this region C results in stable and consistent recording of counter samples for all pulse train edges of the trigger signal T and the recorded counter values will have integer+0.5 values (LSB=1). Finally, in examples, region D may designate a region located around a falling edge of the clock signal CLK_IN with insufficient setup and hold times. Therefore, this region D again results in unstable recording of counter samples for the edges of the trigger signal T, where some counter values are latched on a falling edge (LSB=1) and other counter values are latched on the next rising edge (LSB=0). Similar to region B, this region D, in fact, is what creates the indeterministic nature of the synchronizing circuit at the input of the logger circuit 27.

Figure 6:
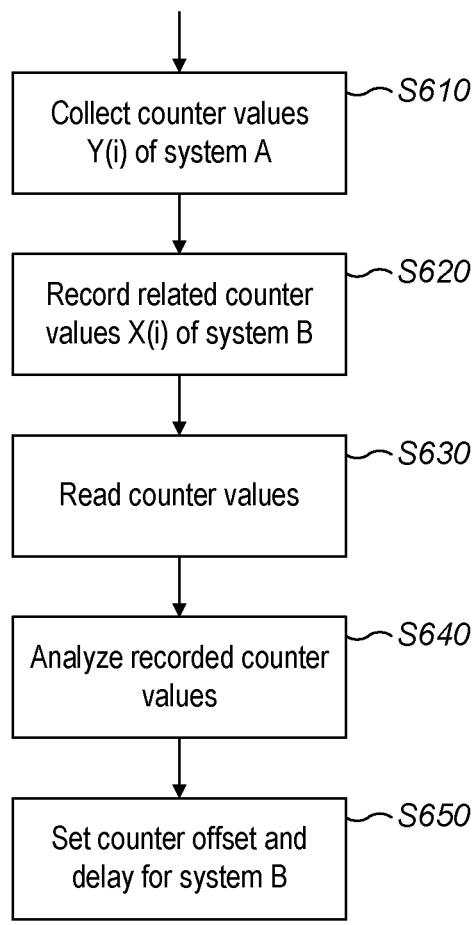
FIG. 6 is a schematic flow diagram of an example of an enhanced synchronization procedure with improved accuracy.

FIG. 6 is a schematic flow diagram of an example of an enhanced synchronization procedure with improved accuracy according to sample embodiments.

The triggering system (e.g. system A) will generate multiple edges of the trigger signal T in response to its counter (e.g. counter 12 in FIG. 2). Thus, the edges of the pulses (rising and/or falling) will occur on pre-defined values of the counter of the triggering system. These pre-defined counter values of the triggering system will be marked as an array [Y(0), Y(1), . . . , Y(N−1)]. In step S610, these counter values Y(i) of the triggering system will be collected by the control circuit (e.g. control circuit 25 of FIG. 4) of the triggered system (e.g. system B). They are predetermined and may be stored at or signalled to the triggered system.

Then, in step S620, the logger circuit of the triggered system (e.g. logger circuit 27 of FIG. 4) will record the values of the counter of the triggered system (e.g. counter 22 of FIG. 4) after which these edges of the trigger signal T were detected at the triggered system. These values will be marked as an array [X(0), X(1), . . . , X(N−1)]. Note that the counter values X(i) recorded at the triggered system may be either an integer or and integer+0.5 due to the double sampling rate of the DDR mechanism.

In other words, each recorded counter value X(i) of the triggered system has one more bit than each collected counter value Y(i) of the triggering system. This additional bit (i.e. LSB) indicates whether the counter value X(i) is an integer (LSB=0) or an integer+0.5 (LSB=1).

In step S630, the control circuit of the triggered system reads the array X after the recording has finished. Then, in step S640, the control circuit of the triggered system analyses the recorded array X based on the collected array Y and sets in step S650 at least one of the offset and the configurable delay of the counter of the triggered system accordingly to improve accuracy of synchronization of the triggered system.

Thus, as indicated above, in example embodiments, the edges of the trigger signal T are generated based on the clock signal CLK_IN at the triggering system and are sampled at the triggered system based on the clock signal CLK_IN of the triggered system. Note that because both systems are frequency aligned (even though they're not phase aligned), as they share the same clock signal of the common clock source (e.g. clock source 30 of FIG. 1), all the edges of the pulse train of trigger signal T will arrive on the same one of the regions A to D of FIG. 5.

By analyzing the recorded counter values of the logger circuit 27, the offset □ between the counters of the two systems can be determined with a resolution of a single cycle of the clock signal CLK_IN. As a further option, based on the above regions A to D in which the edges have arrived, the configurable delay can be determined and set in order to "fine-tune" the offset of the counter of the triggered system with a resolution lower than a single cycle of the clock signal CLK_IN.

In the following, a detailed procedure for an enhanced synchronization accuracy according to an example embodiment is described with reference to FIGS. 7 and 8 based on respective flow diagrams, assuming that the number of bits in the counter of the triggered system is "M" and the number of bits of the counter values recorded by the logger circuit is "M+1" (due to the double-rate sampling (DDR) at rising and falling edges of the clock signal CLK_IN.

Figure 7:
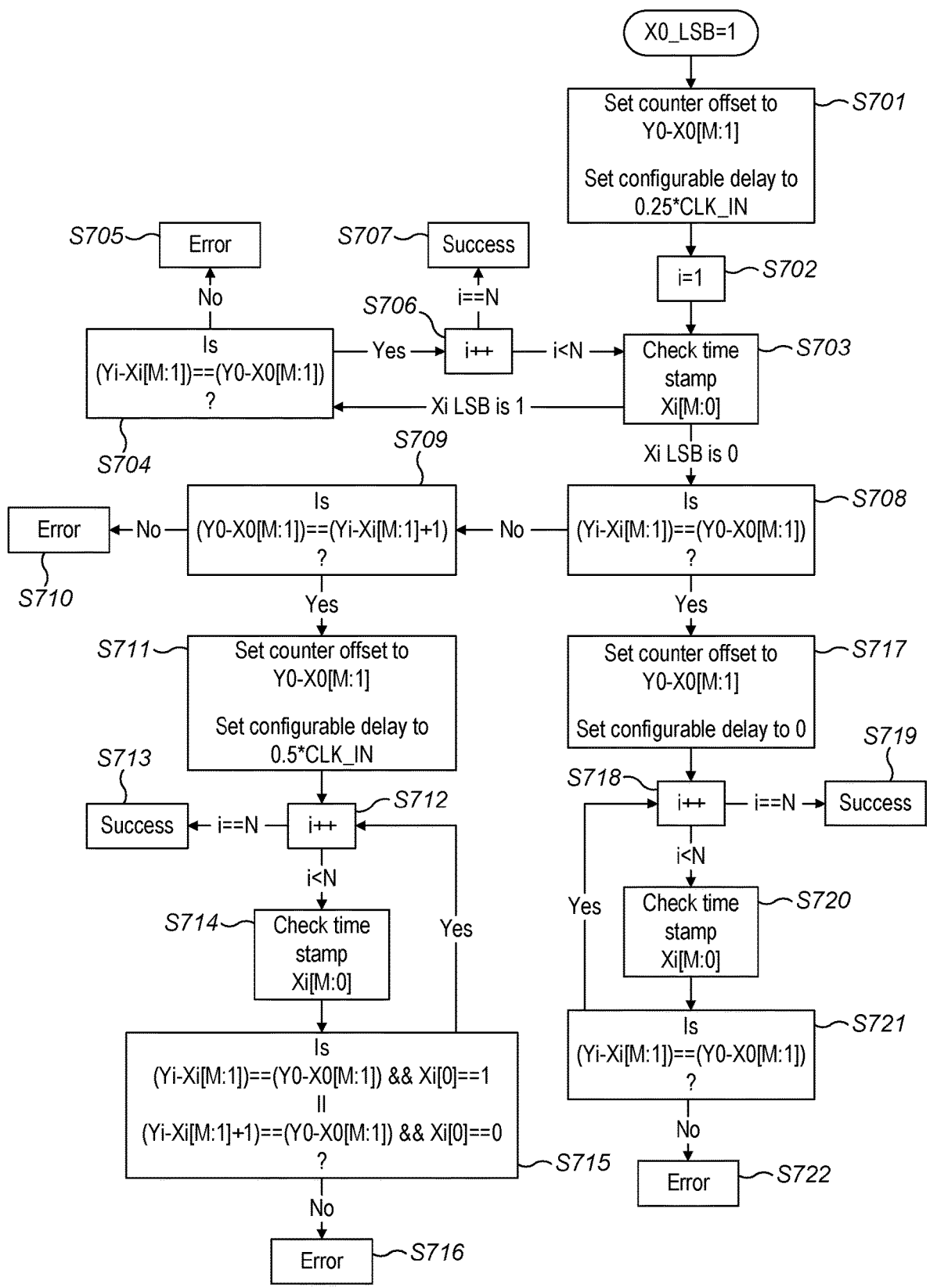
FIG. 7 is a first part of a schematic flow diagram of an example of a procedure for determining a counter offset and a configurable delay.
Figure 8:
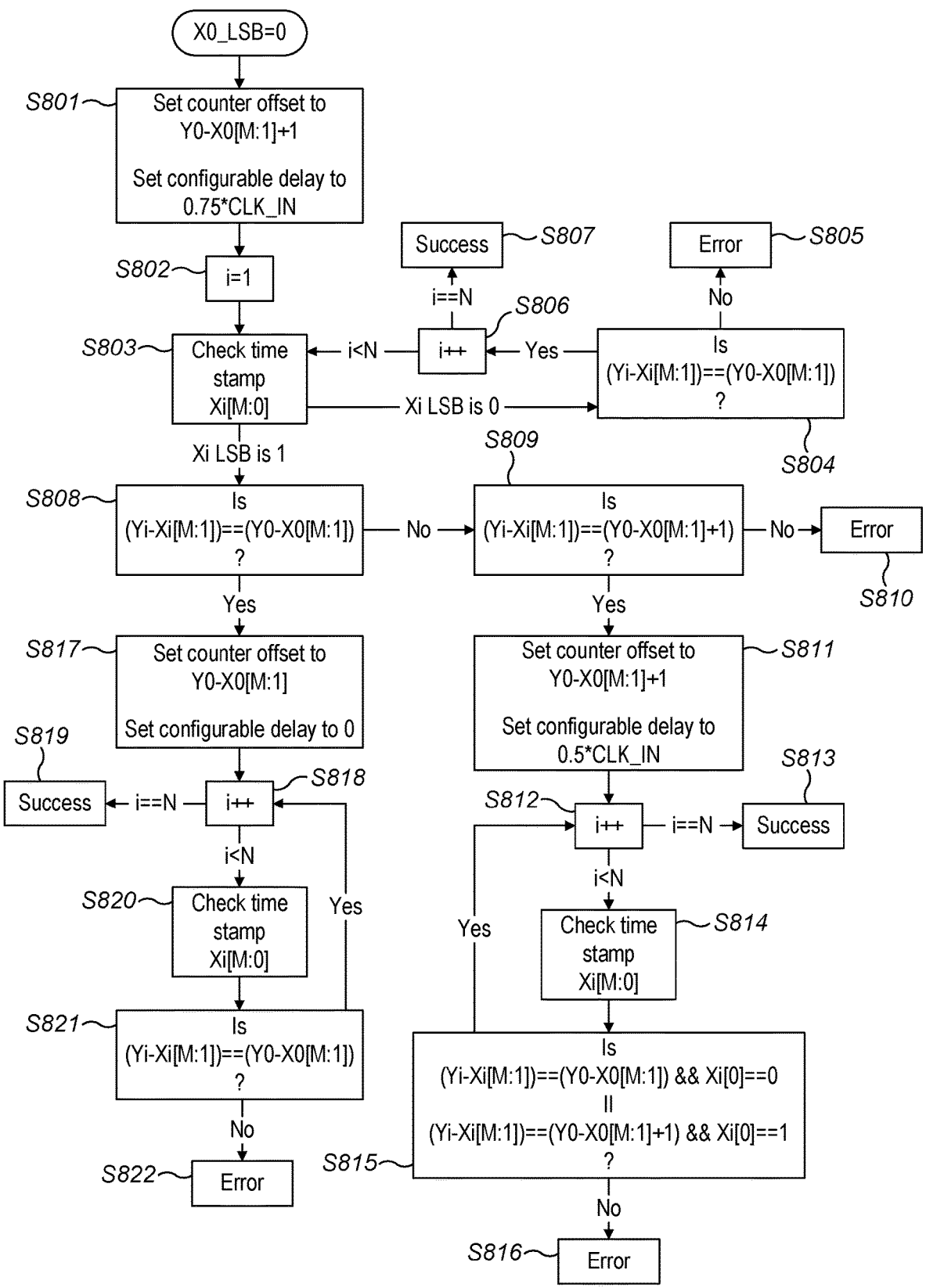
FIG. 8 is a second part of the schematic flow diagram of an example of a procedure for determining a counter offset and a configurable delay.

The procedure may be performed by the control circuit of the triggered system (e.g. control circuit 25 of FIG. 4) to determine at least one of an optimal offset and a configurable delay for the counter of the triggered system, wherein the flow diagrams of FIGS. 7 and 8 relate to different cases or branches of the procedure selected in dependence on an initial count value X0 of the counter of the triggered system (e.g. counter 22 of FIG. 4), e.g., whether an integer value (X0[0]=0) or a non-integer value (X0[0]=1) has been detected as first count value (i.e. time stamp). The maximum value N of the running parameter i corresponds to the number of considered edges of the trigger signal T. As an example, a value N=10 (i.e. 5 cycles) or larger could be selected.

FIG. 7 is a first branch of the flow diagram, which is selected if the LSB of the initial counter value X0 after receipt of a relevant edge of the trigger signal T is "1", i.e., the initial counter value is a non-integer count value (which roughly corresponds to area C of FIG. 5). However, it is not clear yet whether the relevant edge is located in one of areas B or D of FIG. 5.

In step S701, the counter offset □ is set to the difference (Y0−X0[M:1]) between the initial M-bit counter value Y0 of the counter of the triggering system and the initial M-bit counter value X0 of the counter of the triggered system (without consideration of the LSB) and the configurable delay is initially set to a quarter of a clock cycle of the clock signal CLK_IN (i.e. 0.25*CLK_IN). Then, in step S702, a running parameter i is set to "1". Thereafter, in step S703 the current (M+1)-bit counter value (time stamp) Xi[M:0] of the counter of the triggered system is checked. If it is determined that its LSB value is "1", the procedure branches to step S704 and it is checked whether the difference between the collected related M-bit counter value Yi of the counter of the triggering system and the current M-bit counter value Xi of the counter of the triggered system (without consideration of the LSB) and the initial difference between the collected initial M-bit counter value Y0 of the counter of the triggering system and the initial M-bit counter value X0 of the counter of the triggered system (without consideration of the LSB) are identical. If not, the procedure branches to step S705 and an error is determined. Such an error indicates that the measured results are not meaningful, which should normally not happen. If it does, the procedure could be restarted (e.g. the pulse train of the trigger signal could be sent and measured again). If the differences are identical, the procedure branches to step S706 where the running parameter i is incremented (e.g. by one) and it is checked whether the maximum value N of the running parameter i has been reached. If not, the procedure jumps back to step S703. Otherwise, if the running parameter i has reached the maximum value N, the procedure branches to step S707 and a success is determined, i.e., a correct offset and delay for optimal synchronization has been found Otherwise, if it is determined in step S703 that the LSB value of the current counter value Xi is "0", the procedure continues with step S708 where it is checked whether the difference between the collected related M-bit counter value Yi of the counter of the triggering system and the current M-bit counter value Xi of the counter of the triggered system (without consideration of the LSB) and the initial difference between the collected initial M-bit counter value Y0 of the counter of the triggering system and the initial M-bit counter value X0 of the counter of the triggered system (without consideration of the LSB) are identical. If not, the procedure branches to step S709 where it is checked whether the initial difference between the collected initial M-bit counter value Y0 of the counter of the triggering system and the initial M-bit counter value X0 of the counter of the triggered system and the difference between the collected related M-bit counter value Yi of the counter of the triggering system and the current M-bit counter value Xi of the counter of the triggered system (without consideration of the LSB) plus 1 are identical. If not, the procedure branches to step S710 and an error is determined.

If it is determined in step S709 that the differences are identical, the procedure continues with step S711 where the counter offset □□ is set to the initial difference (Y0−X0 [M:1]) between the collected initial M-bit counter value Y0 of the counter of the triggering system and the initial M-bit counter value X0 of the counter of the triggered system and the configurable delay is set to one half of the cycle of the clock signal CLK_IN (i.e. 0.5*CLK_IN). Then, the procedure continues with step S712 where the running parameter i is incremented and where it is checked whether the running parameter i has reached its maximum value N. If so, the procedure branches to step S713 and a success is determined, i.e., optimum values of area B of FIG. 5 have been set for the counter offset and the configurable delay.

If the running parameter i has not yet reached its maximum value N in step S712, the procedure continues with step S714 and the current (M+1)-bit counter value (time stamp) Xi[M:0] of the counter of the triggered system is checked. Then, in step S715, it is checked whether the difference between the collected related M-bit counter value Yi of the counter of the triggering system and the current M-bit counter value Xi of the counter of the triggered system (without consideration of the LSB) and the initial difference between the collected initial M-bit counter value Y0 of the counter of the triggering system and the initial M-bit counter value X0 of the counter of the triggered system (without consideration of the LSB) are identical and the LSB (Xi[0]) is "1", or whether the difference between the collected related M-bit counter value Yi of the counter of the triggering system and the current M-bit counter value Xi of the counter of the triggered system (without consideration of the LSB) plus 1 and the initial difference between the collected initial M-bit counter value Y0 of the counter of the triggering system and the initial M-bit counter value X0 of the counter of the triggered system (without consideration of the LSB) are identical and the LSB (Xi[0]) is "0". If not, the procedure continues with step S716 where an error is determined. Otherwise, if it is determined in step S715 that the differences are identical for one of the cases, the procedure jumps back to step S712 and the running parameter is incremented again.

If it is determined in step S708 that the differences are identical, the procedure continues with step S717 where the counter offset □□ is set to the initial difference (Y0−X0 [M:1]) between the collected initial M-bit counter value Y0 of the counter of the triggering system and the initial M-bit counter value X0 of the counter of the triggered system and the configurable delay is set to zero. Then, the procedure continues with step S718 where the running parameter i is incremented and where it is checked whether the running parameter i has reached its maximum value N. If so, the procedure branches to step S719 and a success is determined, i.e., optimum values of area D of FIG. 5 have been set for the counter offset and the configurable delay.

If the running parameter i has not yet reached its maximum value N in step S718, the procedure continues with step S720 and the current (M+1)-bit counter value (time stamp) Xi[M:0] of the counter of the triggered system is checked. Then, in step S721, it is checked whether the difference between the collected related M-bit counter value Yi of the counter of the triggering system and the current M-bit counter value Xi of the counter of the triggered system (without consideration of the LSB) and the initial difference between the collected initial M-bit counter value Y0 of the counter of the triggering system and the initial M-bit counter value X0 of the counter of the triggered system (without consideration of the LSB) are identical. If not, the procedure continues with step S722 where an error is determined. Otherwise, if it is determined in step S721 that the differences are identical, the procedure jumps back to step S718 and the running parameter is incremented again.

FIG. 8 is a second branch of the flow diagram, which is selected if the LSB of the initial counter value X0 after receipt of a relevant edge of the trigger signal T is "0", i.e., the initial counter value is an integer count value (which roughly corresponds to area A of FIG. 5). However, it is not clear yet whether the relevant edge is located in one of the areas B or D of FIG. 5.

In step S801, the counter offset □ is set to the initial difference between the initial M-bit counter value Y0 of the counter of the triggering system and the initial M-bit counter value X0 of the counter of the triggered system plus 1 (Y0−X0[M:1]+1) and the configurable delay is set to three quarters of a clock cycle of the clock signal CLK_IN (i.e. 0.75*CLK_IN). Then, in step S802, a running parameter i is set to "1". Thereafter, in step S803 the current (M+1)-bit counter value (time stamp) Xi[M:0] of the counter of the triggered system is checked. If it is determined that its LSB value is "0", the procedure branches to step S804 and it is checked whether the difference between the collected related M-bit counter value Yi of the counter of the triggering system and the current M-bit counter value Xi of the counter of the triggered system (without consideration of the LSB) and the initial difference between the collected initial M-bit counter value Y0 of the counter of the triggering system and the initial M-bit counter value X0 of the counter of the triggered system (without consideration of the LSB) are identical. If not, the procedure branches to step S805 and an error is determined. If the differences are identical, the procedure branches to step S806 and the running parameter i is incremented (e.g. by one) and it is checked whether the maximum value N of the running parameter i has been reached. If not, the procedure jumps back to step S803. Otherwise, if the running parameter i has reached the maximum value N, the procedure branches to step S807 and a success is determined, i.e., optimum values of area A of FIG. 5 have been set for the counter offset and the configurable delay.

Otherwise, if it is determined in step S803 that the LSB value of the current counter value Xi is "1", the procedure continues with step S808 where it is checked whether the difference between the collected related M-bit counter value Yi of the counter of the triggering system and the current M-bit counter value Xi of the counter of the triggered system (without consideration of the LSB) and the initial difference between the collected initial M-bit counter value Y0 of the counter of the triggering system and the initial M-bit counter value X0 of the counter of the triggered system (without consideration of the LSB) are identical. If not, the procedure branches to step S809 where it is checked whether the difference between the collected related M-bit counter value Yi of the counter of the triggering system and the current M-bit counter value Xi of the counter of the triggered system (without consideration of the LSB) and the initial difference between the collected initial M-bit counter value Y0 of the counter of the triggering system and the initial M-bit counter value X0 of the counter of the triggered system (without consideration of the LSB) plus 1 are identical. If not, the procedure branches to step S810 and an error is determined.

If it is determined in step S809 that the differences are identical, the procedure continues with step S811 where the counter offset □□ is set to the initial difference between the collected initial M-bit counter value Y0 of the counter of the triggering system and the initial M-bit counter value X0 of the counter of the triggered system plus 1 (Y0−X0[M:1]+1) and the configurable delay is set to one half of the cycle of the clock signal CLK_IN (i.e. 0.5*CLK_IN). Then, the procedure continues with step S812 where the running parameter i is incremented and where it is checked whether the running parameter i has reached its maximum value N. If so, the procedure branches to step S813 and a success is determined, i.e., optimum values of area B of FIG. 5 have been set for the counter offset and the configurable delay.

If the running parameter i has not yet reached its maximum value N in step S812, the procedure continues with step S814 and the current (M+1)-bit counter value (time stamp) Xi[M:0] of the counter of the triggered system is checked. Then, in step S815, it is checked whether the difference between the collected related M-bit counter value Yi of the counter of the triggering system and the current M-bit counter value Xi of the counter of the triggered system (without consideration of the LSB) and the initial difference between the collected initial M-bit counter value Y0 of the counter of the triggering system and the initial M-bit counter value X0 of the counter of the triggered system (without consideration of the LSB) are identical and the LSB (Xi[0]) is "0", or whether the difference between the collected related M-bit counter value Yi of the counter of the triggering system and the current M-bit counter value Xi of the counter of the triggered system (without consideration of the LSB) and the initial difference between the collected initial M-bit counter value Y0 of the counter of the triggering system and the initial M-bit counter value X0 of the counter of the triggered system (without consideration of the LSB) plus 1 are identical and the LSB (Xi[0]) is "1". If not, the procedure continues with step S816 where an error is determined. Otherwise, if it is determined in step S815 that the differences are identical for one of the cases, the procedure jumps back to step S812 and the running parameter is incremented again.

If it is determined in step S808 that the differences are identical, the procedure continues with step S817 where the counter offset □ is set to the initial difference (Y0−X0[M:1]) between the collected initial M-bit counter value Y0 of the counter of the triggering system and the initial M-bit counter value X0 of the counter of the triggered system and the configurable delay is set to zero. Then, the procedure continues with step S818 where the running parameter i is incremented and where it is checked whether the running parameter i has reached its maximum value N. If so, the procedure branches to step S819 and a success is determined, i.e., optimum values of area D of FIG. 5 have been set for the counter offset and the configurable delay.

If the running parameter i has not yet reached its maximum value N in step S818, the procedure continues with step S820 and the current (M+1)-bit counter value (time stamp) Xi[M:0] of the counter of the triggered system is checked. Then, in step S821, it is checked whether the difference between the collected related M-bit counter value Yi of the counter of the triggering system and the current M-bit counter value Xi of the counter of the triggered system (without consideration of the LSB) and the initial difference between the collected initial M-bit counter value Y0 of the counter of the triggering system and the initial M-bit counter value X0 of the counter of the triggered system (without consideration of the LSB) are identical. If not, the procedure continues with step S822 where an error is determined. Otherwise, if it is determined in step S821 that the differences are identical the procedure jumps back to step S818 and the running parameter is incremented again.

Thus, in sample embodiments according to the procedures of FIGS. 7 and 8, the binary value of the LSB of an initially recorded (M+1)-bit counter value of the counter of the triggered system is used for a preliminary setting of the counter offset □ at the triggered system to either the initial difference between the initial M-bit counter value Y0 of the counter of the triggering system and the initial M-bit counter value X0 of the triggered system (if LSB=1) or the initial difference plus 1 (if LSB=0) and for a preliminary setting of the configurable delay at the triggered system to either 0.25 CLK_IN (if LSB=1, which corresponds to area C) or 0.75 CLK_IN (if LSB=0, which corresponds to area A). These preliminary settings are maintained if the difference between a predetermined number N of succeeding related collected counter values Yi and recorded counter values Xi of both systems stays identical to the initial difference between the initial counter values Y0 and X0.

However, if it is determined that the binary value of the LSB of one of the predetermined number N of succeeding recorded counter values Xi has changed, then the preliminary setting of the configurable delay at the triggered system is set to either zero (if the above differences are identical, which corresponds to area D) or 0.5 CLK_IN (if the above differences differ by 1, which corresponds to area B). Furthermore, the counter offset □ at the triggered system may then be set to the above initial difference plus 1 if the LSB has changed to "1".

It is noted that optimal performance can be achieved if all four regions A to D are equal in size (i.e. 0.25 CLK_IN cycle). This will lead to a synchronization accuracy of one eighth of a cycle period of the clock signal CLK_IN (i.e. −/+(CLK_IN cycle)/8).

In example cases, the setup and hold times may be very small, thus making regions B and D negligible in comparison to regions A and C. This scenario will then lead to a synchronization accuracy of one quarter of a cycle period of the clock signal CLK_IN (i.e. −/+(CLK_IN cycle)/4).

Therefore, the above procedure for determining the offset and configurable delay of the counter of the triggered system may take advantage of the indeterminism of the synchronizing circuit in order to increase the overall accuracy.

In examples, the counter offset adjustment may be used separately for rough compensation with an accuracy of 1 clock cycle, while the adjustment of configurable delay may be used for fine compensation with an accuracy below one clock cycle, e.g., between one eighth and one quarter of a clock cycle.

For verification that the synchronization process was successful, the system may re-run the procedure while switching the roles of the triggering system (e.g. system A) and the triggered system (e.g. system B, so that system B is now triggering and system A is triggered) and verifying that the calculated offset is zero. As another option, verification could be achieved by having both systems drive a signal when they reach a specific counter value and then measuring the time difference between the two signals e.g. using a testing equipment.

The processing steps or operations of the procedures of FIGS. 6, 7 and 8 may be implemented by software routines used for controlling the control circuit of the triggered system (e.g. the control circuit 25 of FIG. 4) or by hardware circuits or a digital signal processor (DSP) or an application specific integrated circuit (ASIC) or a programmable logic device (PLD) or a programmable gate array (PGA) or the like.

A Matlab simulation was performed which simulated the two systems. The simulation covered both the synchronization procedure (i.e. the physical connection between the two systems, the pulse train, the recording of the logger circuit, etc . . . ) and the procedure of FIGS. 7 and 8 that determines the optimal offset and configurable delay in order to synchronize the two systems with enhanced accuracy. The simulation was done 1000 times, each with a random phase shift between the clock signals CLK_IN of the triggering system (system A) and the triggered system (system B). The frequency of the clock signal CLK_IN was set to 20 MHz, the initial offset between the counter of the triggering system and the counter of the triggered system was set to 1000, the number of pulses in pulse train of the trigger signal was set to 8 (i.e. 16 edges), and the frequency of the fast clock at the output of the PLL circuit as set to 150 MHz. This parameter value determine the resolution in which the procedure can set the configurable delay.

Figure 9:
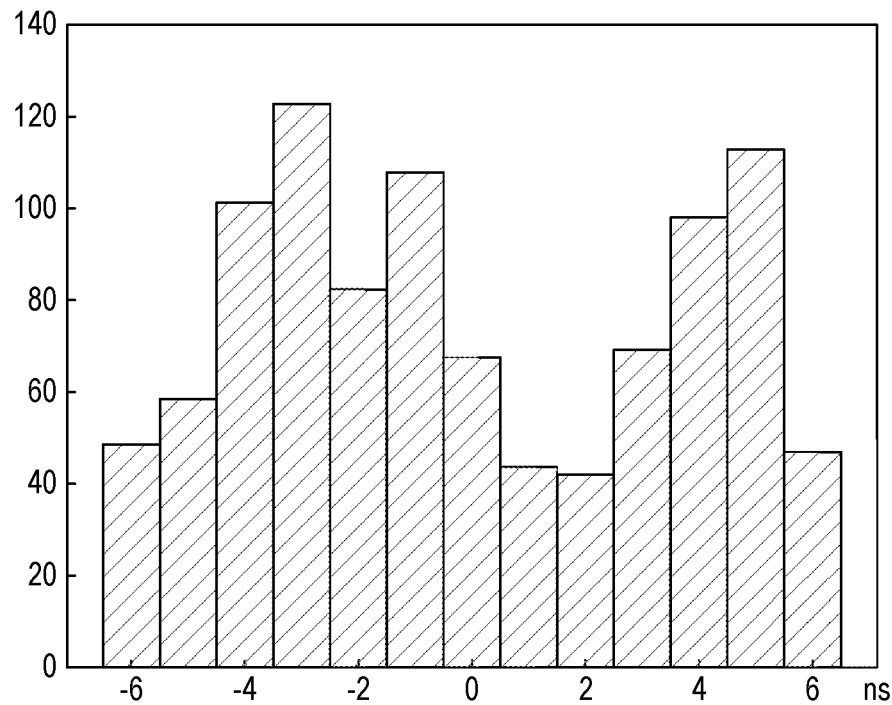
FIG. 9 is a diagram of an example of a histogram of resulting inaccuracies between two systems after synchronization with longer hold and setup times.
Figure 10:
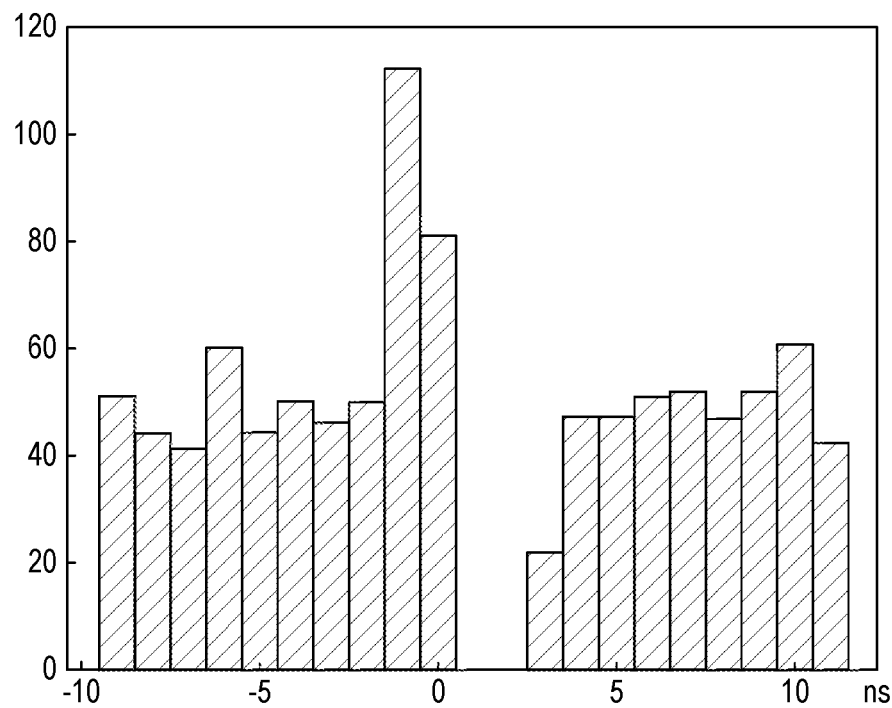
FIG. 10 is a diagram of an example of a histogram of resulting inaccuracies between two systems after synchronization with shorter hold and setup times.

The below graphs in FIGS. 9 and 10 show respective histograms of the resulted inaccuracy between the two counters, after the synchronization procedure was performed, in units of ns.

FIG. 9 is a diagram of an example of a histogram of resulting inaccuracies between two systems after synchronization with longer hold and setup times equal to 6 ns, so that regions A, B, C and D of FIG. 5 are roughly equal in size. As can be gathered from FIG. 9, the inaccuracy is roughly −/+6 ns, which is equal to one eighth of the cycle period of the clock signal CLK_IN (i.e. −/+(CLK_IN cycle)/8).

FIG. 10 is a diagram of an example of a histogram of resulting inaccuracies between two systems after synchronization with a shorter hold and setup times equal to only 1 ns, so that regions A and C are much bigger than regions B and D. As can be gathered from FIG. 10, the inaccuracy is a little less than −/+12 ns, which is equal to one quarter of the cycle period of the clock signal CLK_IN (i.e. −/+ (CLK_IN cycle)/4).

This disclosure has presented example embodiments of an apparatus and a procedure for synchronizing the time bases of two systems with higher accuracy of less than one clock cycle period, wherein a triggered system is synchronized to a triggering system by tracking the timing of rising and falling edges of a clock signal at the triggered system and using the tracked timing values for phase shift adjustment of the time base at the triggered systems.

More generally, according to one aspect disclosed herein, there is provided an apparatus for synchronizing a synchronization signal to an input trigger signal, the apparatus comprising:

a logger circuit for sampling and recording values of a counter in response to a detection of rising and/or falling edges of the input trigger signal, wherein the sampling is performed at rising and falling edges of a common clock signal supplied to the counter; and a control circuit for reading the recorded values and calculating at least one of an offset and a configurable delay of the counter based on the recorded values.

In embodiments, the apparatus may further comprise a synchronizing circuit, wherein the logger circuit and the synchronizing circuit are configured to become active at the rising and falling edges of the common clock signal.

In embodiments, the apparatus may further comprise a configurable delay circuit configured to add the configurable delay to the common clock signal before it is supplied to the counter, or to the output of the counter, or to a trigger output generated based on the output of the counter.

In embodiments, the configurable delay circuit may be controlled by a fast clock signal with a clock frequency higher than that of the common clock signal. In examples, the fast clock signal may be generated on the basis of the common clock signal.

In embodiments, the control circuit may be configured to collect predefined counter values which correspond to the rising and/or falling edges of the input trigger signal and to calculate the at least one of the offset and the configurable delay of the counter based on a comparison of the recorded values with the collected predefined counter values.

In embodiments, the recorded values may have one more bit than the collected counter values, and wherein this one more bit is used to indicate whether the recorded value is an integer or a non-integer value depending on whether it is sampled at a rising edge or a falling edge of the clock signal.

In embodiments, the control circuit may be configured to use the binary value of a least significant bit, LSB, of an initial one of the recorded values for a preliminary setting of the offset of the counter to either an initial difference between an initial one of the collected counter values and an one of the recorded values if the LSB indicates a non-integer value, or the initial difference plus 1 if the LSB indicates an integer value.

In embodiments, the control circuit may be configured to use the binary value of the LSB of the initial one of the recorded values for a preliminary setting of the configurable delay to either one quarter of a clock cycle of the common clock signal if the LSB indicates a non-integer value, or three quarters of the clock cycle of the common clock signal if the LSB indicates an integer value.

In embodiments, the control circuit may be configured to maintain the preliminary setting if respective differences between a predetermined number of succeeding related collected counter values and recorded values stay identical to the initial difference.

In embodiments, if the control circuit determines that the binary value of the LSB of one of the predetermined number N of succeeding recorded values has changed, the control unit may be configured to set the preliminary setting of the configurable delay to either zero if the respective difference and the initial difference are identical, or one half of the clock cycle of the common clock signal if the respective difference and the initial difference differ by 1.

In embodiments, the control circuit may be configured to set the offset of the counter to the initial difference plus 1 if the LSB has changed to indicate a non-integer value.

According to another aspect disclosed herein, there is provided a method of synchronizing a synchronization signal to an input trigger signal, the method comprising:

sampling and recording values of a counter in response to a detection of rising and/or falling edges of the input trigger signal, wherein the sampling is performed at rising and falling edges of a common clock signal supplied to the counter; and calculating at least one of an offset and a configurable delay of the counter based on the recorded values In embodiments, the method may further comprise adding the configurable delay to the common clock signal before it is supplied to the counter, or to the output of the counter, or to a trigger output generated based on the output of the counter According to another aspect disclosed herein, there is provided a computer program embodied on computer-readable storage and comprising code configured so as when run on one or more processors to perform the method of any embodiment disclosed herein.

Examples and embodiments described herein may be implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system used for implementation. Accordingly, logical operations making up examples or embodiments described herein may be referred to variously as operations, steps, objects, or modules. Furthermore, it should be understood that logical operations may be performed in any order, adding and omitting as desired, unless explicitly claimed otherwise or a specific order is inherently necessitated by the claim language.

Other variants and applications of the disclosed techniques may become apparent to a person skilled in the art once given the present disclosure. The scope of the present disclosure is not limited by the above-described embodiments but only by the accompanying claims.

The invention claimed is:

1. An apparatus for synchronizing a counter to an input trigger signal, the apparatus comprising:
   a data acquisition component for sampling and recording values of the counter in response to a detection of rising and/or falling edges of the input trigger signal, wherein the sampling is performed at rising and falling edges of a common clock signal supplied to the counter and the data acquisition component; and
   a control circuit for reading the recorded values and calculating at least one of an offset and a configurable delay of the counter based on the recorded values and predetermined collected values that are collected, by the control circuit, from predefined counter values that correspond to the rising and/or falling edges of the input trigger signal.

2. The apparatus of claim 1, further comprising a synchronizing circuit, wherein the data acquisition module and the synchronizing circuit are configured to become active at the rising and falling edges of the common clock signal.

3. The apparatus of claim 1, further comprising a configurable delay circuit configured to add the configurable delay to the common clock signal before it is supplied to the counter, or to the output of the counter, or to a trigger output generated based on the output of the counter.

4. The apparatus of claim 3, wherein the configurable delay circuit is controlled by a fast clock signal with a clock frequency higher than that of the common clock signal.

5. The apparatus of claim 4, wherein the fast clock signal is generated on the basis of the common clock signal.

6. The apparatus of claim 1, wherein the control circuit is configured to obtain the predetermined collected values by collecting predefined counter values which correspond to the rising and/or falling edges of the input trigger signal and to calculate the at least one of the offset and the configurable delay of the counter based on a comparison of the recorded values with the collected predefined counter values.

7. The apparatus of claim 6, wherein the recorded values have one more bit than the collected counter values, and wherein this one more bit is used to indicate whether the recorded value is an integer or a non-integer value depending on whether it is sampled at a rising edge or a falling edge of the clock signal.

8. The apparatus of claim 7, wherein the control circuit is configured to use the binary value of a least significant bit, LSB, of an initial one of the recorded values for a preliminary setting of the offset of the counter to either an initial difference between an initial one of the collected counter values and an one of the recorded values if the LSB indicates a non-integer value, or the initial difference plus 1 if the LSB indicates an integer value.

9. The apparatus of claim 8, wherein the control circuit is configured to use the binary value of the LSB of the initial one of the recorded values for a preliminary setting of the configurable delay to either one quarter of a clock cycle of the common clock signal if the LSB indicates a non-integer value, or three quarters of the clock cycle of the common clock signal if the LSB indicates an integer value.

10. The apparatus of claim 8, wherein the control circuit is configured to maintain the preliminary setting if respective differences between a predetermined number of succeeding related collected counter values and recorded values stay identical to the initial difference.

11. The apparatus of claim 10, wherein if the control circuit determines that the binary value of the LSB of one of the predetermined number N of succeeding recorded values has changed, the control unit is configured to set the preliminary setting of the configurable delay to either zero if the respective difference and the initial difference are identical, or one half of the clock cycle of the common clock signal if the respective difference and the initial difference differ by 1.

12. The apparatus according of claim 11, wherein the control circuit is configured to set the offset of the counter to the initial difference plus 1 if the LSB has changed to indicate a non-integer value.

13. A method of synchronizing a counter to an input trigger signal, the method comprising:
    sampling and recording values of a counter in response to a detection of rising and/or falling edges of the input trigger signal, wherein the sampling is performed at rising and falling edges of a common clock signal supplied to the counter; and
    calculating at least one of an offset and a configurable delay of the counter based on the recorded values and predetermined collected values that are collected, by the control circuit, from predefined counter values that correspond to the rising and/or falling edges of the input trigger signal.

14. The method of claim 13, further comprising adding the configurable delay to the common clock signal before it is supplied to the counter, or to the output of the counter, or to a trigger output generated based on the output of the counter.

15. A computer program embodied on computer-readable storage and comprising code configured so as when run on one or more processors to perform the method of synchronizing a counter to an input trigger signal:
    sampling and recording values of a counter in response to a detection of rising and/or falling edges of the input trigger signal, wherein the sampling is performed at rising and falling edges of a common clock signal supplied to the counter; and
    calculating at least one of an offset and a configurable delay of the counter based on the recorded values and predetermined collected values that are collected, by the control circuit, from predefined counter values that correspond to the rising and/or falling edges of the input trigger signal.

16. The computer program of claim 15, wherein the method further comprises adding the configurable delay to the common clock signal before it is supplied to the counter, or to the output of the counter, or to a trigger output generated based on the output of the counter.

17. The computer program of claim 15, the method further comprising adding the configurable delay to the common clock signal before it is supplied to the counter.

18. The computer program of claim 15, the method further comprising adding the configurable delay to the common clock signal before it is supplied to the output of the counter.

19. The computer program of claim 15, the method further comprising adding the configurable delay to the common clock signal before it is supplied to a trigger output generated based on the output of the counter.

20. The computer program of claim 15, the method further comprising obtaining the predetermined collected values by collecting predefined counter values which correspond to the rising and/or falling edges of the input trigger signal and to calculate the at least one of the offset and the configurable delay of the counter based on a comparison of the recorded values with the collected predefined counter values.

* * * * *